United States Patent [19]

Hutson

[11] 4,163,241

[45] Jul. 31, 1979

[54] MULTIPLE EMITTER AND NORMAL GATE SEMICONDUCTOR SWITCH

[76] Inventor: Jearld L. Hutson, P.O. Box 34235, Dallas, Tex. 75234

[21] Appl. No.: 852,686

[22] Filed: Nov. 18, 1977

Related U.S. Application Data

[63] Continuation of Ser. No. 586,741, Jun. 13, 1975, abandoned, which is a continuation-in-part of Ser. No. 538,917, Jan. 6, 1975, abandoned.

[51] Int. Cl.² .......................................... H01L 29/74
[52] U.S. Cl. .................................. 357/38; 357/55; 307/252 G; 307/305
[58] Field of Search .................. 357/38, 39, 55, 86; 307/252 A, 252 C, 252 G, 325

[56] References Cited

U.S. PATENT DOCUMENTS

| 3,243,602 | 3/1966 | Storm | 357/38 |
|---|---|---|---|
| 3,284,680 | 11/1966 | Gentry et al. | 357/38 |
| 3,401,320 | 9/1968 | Weinstein | 357/38 |
| 3,816,759 | 6/1974 | Shepherd | 357/38 |
| 4,089,024 | 5/1978 | Tanaka | 357/38 |

Primary Examiner—Joseph E. Clawson, Jr.
Attorney, Agent, or Firm—Richards, Harris & Medlock

[57] ABSTRACT

The specification discloses a multilayer semiconductor rectifier having an emitter gate, a cathode and an anode. In addition, the rectifier includes at least one region of semiconductor material electrically remote from the emitter gate. A second gate electrode contacts the region in order to provide additional switching control to the rectifier. In one embodiment of the invention, the second gate electrode may be biased to inhibit gating operation by the emitter gate electrode. Thus, switching signals may be applied to both the emitting gate and the second gate electrode in order to switch the rectifier. In another embodiment, gating signals may be applied to the emitter gate in order to render the rectifier conductive, while gating signals may be applied to the second gate electrode in order to render the rectifier nonconductive.

6 Claims, 7 Drawing Figures

MULTIPLE EMITTER AND NORMAL GATE SEMICONDUCTOR SWITCH

This is a continuation of application Ser. No. 586,741, filed June 13, 1975, now abandoned, which was a continuation-in-part of application Ser. No. 538,917, filed Jan. 6, 1975, now abandoned.

RELATED APPLICATIONS

This invention is an improvement of co-pending patent application Ser. No. 538,917, filed Jan. 6, 1975, and entitled "SEMICONDUCTOR SWITCH HAVING SENSITIVE GATE CHARACTERISTICS AT HIGH TEMPERATURES" by applicant.

FIELD OF THE INVENTION

This invention relates to a multilayer switching device, and more particularly relates to a semiconductor rectifier having a plurality of gates.

THE PRIOR ART

Conventional silicon controlled rectifiers (SCR's) include a gate, a cathode and an anode. The SCR's are rendered conductive and nonconductive by gating signals applied to the gate of the SCR. When metal oxide semiconductor (MOS) devices are utilized to drive such conventional SCR's, problems have heretofore arisen with the generation of high reverse voltage pulses, commonly termed voltage kickback. This problem has been substantially eliminated by the use of an emitter gate switch such as disclosed in co-pending patent application Ser. No. 538,917, filed Jan. 6, 1975, by applicant and entitled "SEMICONDUCTOR SWITCH HAVING SENSITIVE GATE CHARACTERISTICS AT HIGH TEMPERATURES".

However, previously developed semiconductor switches have been limited in that the same gate terminal must be utilized to turn the device on and off. This constraint substantially reduces these circuit capabilities of the device, and limits the use of the device in logic circuits or the like. A need has thus arisen for a rectifier which substantially eliminates the generation of high reverse voltage pulses during switching operation and which also includes more than one gate for control thereof. In particular, a need has arisen for a semiconductor rectifier having at least two gates, one of which may be utilized to inhibit the other, thereby substantially increasing the operational capabilities of the device.

SUMMARY OF THE INVENTION

In accordance with the present invention, an emitter gate semiconductor rectifier includes a semiconductor body having a plurality of interleaved layers of alternating first and second conductivity types. An emitting gate region of the first conductivity type is formed in a layer of the second conductivity type. A first gate electrode contacts the emitting gate region to provide switching control of the rectifier. Anode and cathode electrodes contact portions of the semiconductor body. A second gate electrode contacts an area of the semiconductor body remote from the emitting gate region to provide additional switching control of the rectifier.

In accordance with another aspect of the invention, a multilayer semiconductor rectifier has an emitter gate, a cathode and an anode. A region of semiconductor material is electrically remote from the emitter gate. A second gate electrode contacts the region for providing additional switching control to the rectifier. In one embodiment of the invention, the second gate electrode is operable to inhibit gating operation of the emitter gate.

In accordance with a more specific aspect of the invention, a semiconductor body includes at least four interleaved layers of alternating first and second conductivity types. A highly doped region of the first conductivity type is formed in a first exterior layer of the body of the second conductivity type. A portion of an interior layer of the first conductivity type extends through the first exterior layer. A first electrode electrically connects to the highly doped region. A second electrode contacts the first exterior layer. A third electrode contacts a portion of the interior layer. A fourth electrode connects to the layer of the first conductivity type.

DESCRIPTION OF THE DRAWINGS

For a more complete understanding of the present invention and for further objects and advantages thereof, reference is now made to the following description, taken in conjunction with the accompanying drawings, in which.

DESCRIPTION OF THE PREFERRED EMBODIMENT

Figure 1:
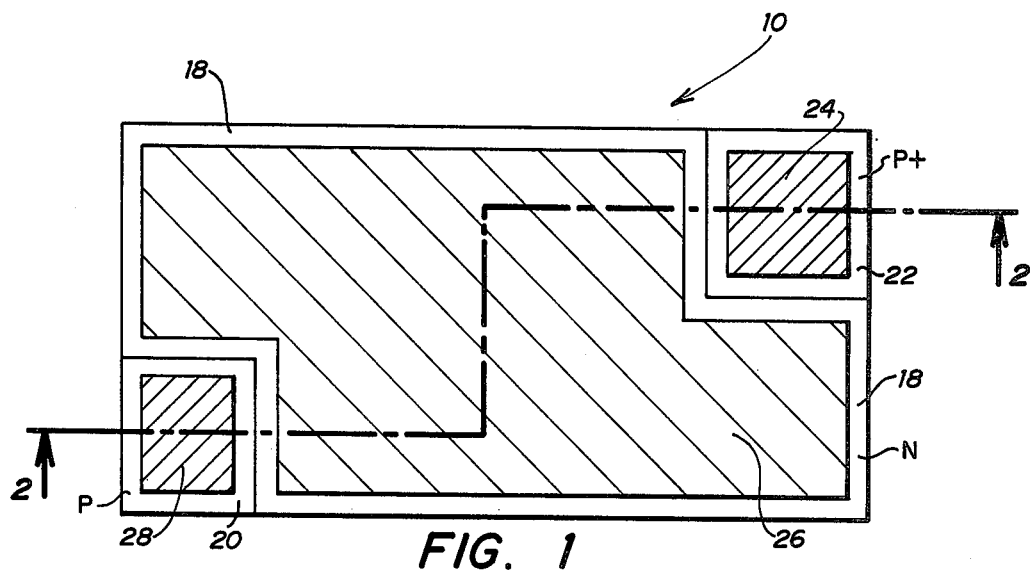
FIG. 1 is a top view of the preferred embodiment of the invention.
Figure 2:
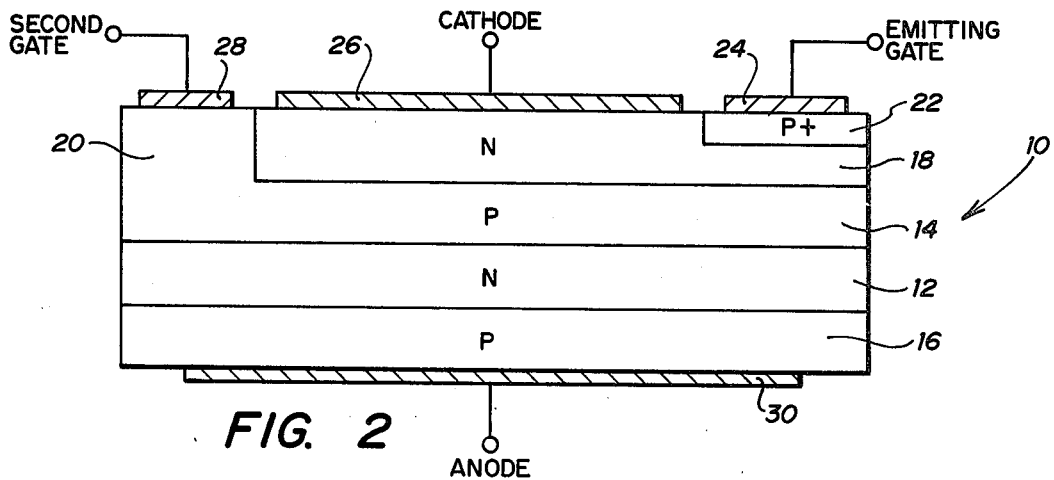
FIG. 2 is a sectional view taken generally along the section lines 2—2 of FIG. 1.

Referring to FIGS. 1 and 2, wherein like numerals are utilized for like and corresponding parts in the various views, a semiconductor body is designated generally by the numeral 10. Body 10 includes an interior layer 12 of N-type conductivity material surrounded on opposite sides by P-type conductivity material layers 14 and 16. An exterior N-type layer 18 is formed adjacent P-type layer 14, with a portion 20 of the P-type layer 14 extending through N-type layer 18. A region 22 of P+ material is formed in N-type layer 18. As shown in FIG. 1, portion 20 is remotely located on body 10 from region 22, although it will be understood that portion 20 and region 22 could be adjacently disposed in the same region of body 10. Region 22 is electrically isolated in order to provide an emitting gate.

An electrode 24 contacts the P+ layer 22 to form an emitting gate electrode. An electrode 26 contacts the N-type exterior layer 18 to form a cathode. An electrode 28 contacts exposed region 20 of the P-type layer 14 to form a second gate electrode. An electrode 30 contacts the P-type layer 16 to form an anode.

It will be understood that the construction of the body 10 shown in FIGS. 1 and 2 may be accomplished by any of a large number of commonly used fabrication techniques, which will now thus be discussed in detail. For example, an N-type conductivity silicon wafer may be diffused on both sides in various steps to form the four layers 12, 14, 16 and 18. The P+ region 22 may then be formed in layer 18 by conventional diffusion techniques using suitable dopants or impurities which are compatible with the particular semiconductor material being operated upon. The particular size and shape of the diffused regions are of course determined by suitable masking and photographic techniques conventionally employed in semiconductor diffusion technology.

It will be understood that any suitable semiconductor material may be utilized to form the devices according to the invention, but for clarity of illustration, reference is made in the drawings to particular electrical conductivity types and silicon as the material being utilized. It will, of course, be understood that the electrical conductivity types herein specified may be interchanged and reversed. The N and P layers may be provided with impurity concentrations according to conventional ranges. The P+ region 22 may, for example, be provided with an impurity concentration of conventional levels such as between $10^{19}$ and $10^{21}$.

Figure 3:
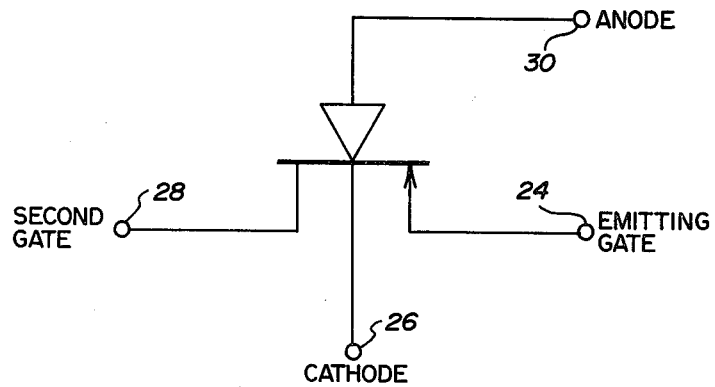
FIG. 3 is a schematic diagram illustrating the device shown in FIGS. 1 and 2.

FIG. 3 illustrates an electrical schematic representation of the four terminal dual gate device shown in FIGS. 1 and 2. The anode terminal 30, the cathode 26 and the emitting gate 24 are illustrated in the conventional manner. The second gate 28 is shown to indicate that it also can exert control over the gating operation of the switch.

Operation of the switching device shown in FIG. 3 will now be described. As is known, with a conventional SCR, the single gate electrode receives positive pulses in order to render the device conductive and negative pulses to turn the device off. An important feature of the present device is that the emitting gate 24 may receive positive pulses in order to render the device conductive, while the second gate 28 may receive negative pulses in order to render the device non-conductive. This enables the utilization of two pulse generating circuits for control of the switch as desired.

Another important feature of the present switch is that the second gate 28 may inhibit the operation of the emitting gate 24. For example, if the present device is properly biased, with a negative voltage being applied to the second gate 28, the emitting gate 24 will not fire when a positive pulse is applied thereto. Only when a positive pulse is also applied to the second gate 28 is the switch rendered conductive. However, the emitting gate 24 does not inhibit operation of the second gate 28. Therefore, when a negative pulse is applied to the second gate 28, the device is rendered nonconductive. If desired, the circuitry in which the switch is used may be designed such that a sufficiently high positive voltage may be applied to the emitting gate 24 in order to override the inhibiting effect of the second gate 28. Alternatively, the circuitry can be designed such that sufficiently high voltage cannot be applied to the emitting gate 24 in order to override the inhibiting effect to the second gate 28.

Another advantage of the present device is that the isolated gate structure tends to eliminate the occurrence of high voltage feedback or kickback upon the application of switching currents thereto. As previously described, such high voltage kickback can substantially damage MOS driving circuitry. Due to the isolation and shielding of the present emitter gate, such kickback is substantially eliminated. It may thus be seen that the present dual gate switch may advantageously be utilized in a wide variety of circuits due to the inhibiting feature, and may be utilized to perform logic functions in integrated circuitry and the like.

Figure 4:
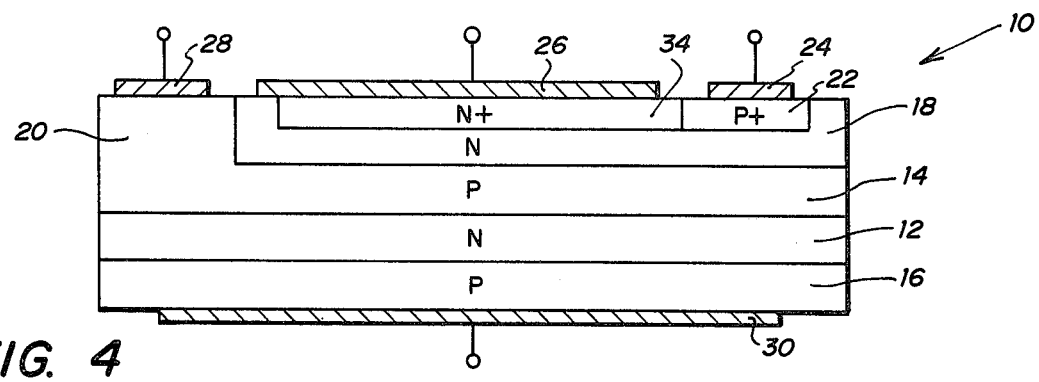
FIG. 4 is a side view of a second embodiment of the invention.

FIG. 4 illustrates a variation of the device shown in FIGS. 1 and 2, with like numerals being utilized for like and corresponding parts. The only difference in the device shown in FIG. 4 from that previously described is the addition of a region 34 of N+ material. The electrode 26 shorts across the region 34 and the N-type layer 18. The N+ region may be provided with an impurity concentration of conventional levels such as approximately $10^{21}$ or greater. Operation of the device shown in FIG. 4 is similar to that previously described.

Figure 5:
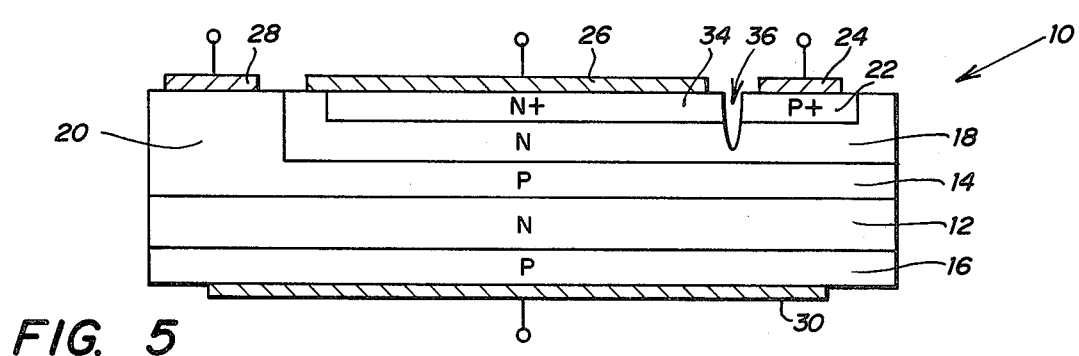
FIG. 5 is a sectional view of an alternative embodiment of the invention.

FIG. 5 illustrates a device generally similar to that shown in FIG. 4, with the exception of a groove 36. Groove 36 is formed completely across the device and separates the P+ region 22 from the N+ region 34. The groove 36 thus provides additional isolation to the P+ region 22 and the emitting gate electrode 24. The device shown in FIG. 5 provides excellent electrical isolation between the gates 24 and 28 and the remainder of the device.

Figure 6:
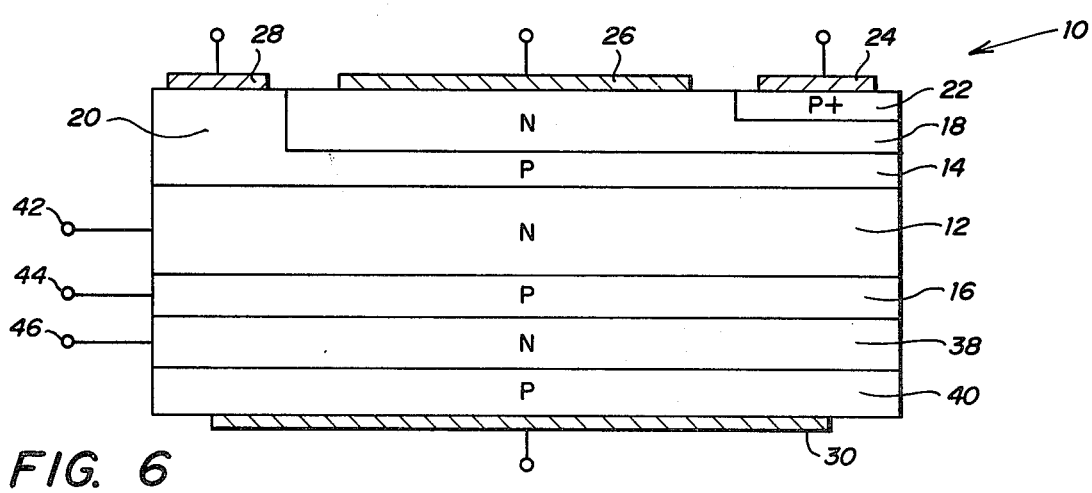
FIG. 6 is a side view of another alternative embodiment of the invention.

FIG. 6 illustrates an alternative embodiment of the invention wherein additional P-N junctions are provided. The device illustrated in FIG. 6 comprises a seven layer switch which is substantially similar to that shown in FIG. 2, with the addition of an N-type layer 38 and a P-type layer 40. Electrode 30 contacts the P-type layer 40. It will thus be understood that the present device may utilize additional layers of alternating types of opposite conductivity types in order to provide additional P-N junctions in order to raise the voltage capacity of the device.

Electrodes 42, 44 and 46 are respectively connected to interior layers 12, 16 and 38. Suitable gating signals may be applied to electrodes 42–46 in order to provide additional switching control of the switch.

Figure 7:
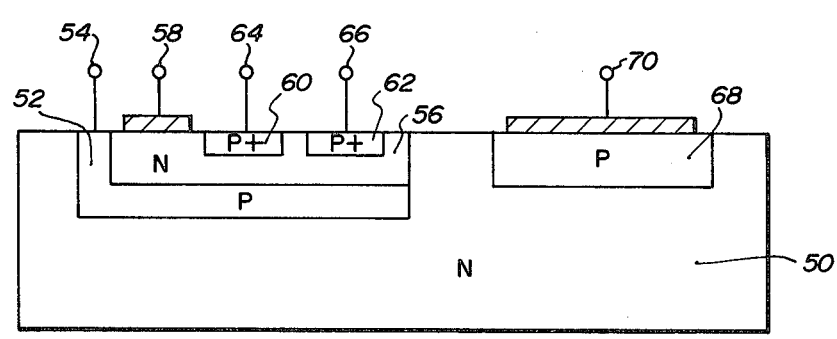
FIG. 7 is a sectional view of a lateral configuration according to the invention.

FIG. 7 illustrates an embodiment of the present invention constructed in a lateral configuration. It is understood that the present invention may be constructed in a variety of lateral and bilateral configurations. Referring to FIG. 7, an N-type substrate 50 has a P-type layer 52 formed therein, with a portion thereof extending to the exterior surface and connected to an electrode 54. An N-type region 56 is formed adjacent P-type layer 52 and is connected to an electrode 58 to the exterior surface thereof. A plurality of P+ regions 60 and 62 are formed in the N-type layer 56 and are connected to electrodes 64 and 66, respectively. A P+ region 68 is formed in N-type layer 50 and is connected to an electrode 70.

Emitter electrodes 64 and 66 operate as isolated emitter gates which are independent and common only to the cathode region. The electrode 58 comprises the cathode electrode. Electrode 54 comprises a cathode gate electrode. Electrode 70 comprises the anode terminal. Gating signals may thus be provided to the isolated emitter gate electrodes 64 and 66 to provide switching operation to the device. Additionally, gating signals may be applied to the cathode gate 54 in order to provide switching operations. Although only two emitter gate regions are illustrated, it will be understood that a large number of isolated emitter gate regions may be provided with the present invention. The cathode gate electrode 54 comprises an inhibit gate to inhibit operation of the emitter gate. If desired, an N-type region may be provided within P-type region 68 and attached to an electrode in order to provide an anode gate in order to provide further inhibiting functions to the switch.

It will thus be seen that the present invention provides an asynchronous semiconductor switch in which a variety of switching functions may be accomplished. Due to a plurality of gates, logic functions may be accomplished with the present switch, as certain gates may be utilized to inhibit the operation of other gates. In some embodiments of the invention, switch signals must be applied to two or more gates in order to cause operation of the switch. In other operations of the switch, a positive signal must be applied to one electrode in order to render the switch conductive while a negative gate must be applied to a second electrode in order to render the switch non-conductive. Due to construction of the switch, voltage kickback upon the switching of the device with high currents is substantially eliminated, thereby enabling use of the switch with MOS driving circuitry.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. An emitter gate semiconductor rectifier comprising:
   a semiconductor body including at least four interleaved layers of alternating opposite first and second semiconductor conductivity types to form a plurality of P-N junctions;
   said semiconductor body having a first exterior layer of said first semiconductor conductivity type and a second exterior layer of said second semiconductor conductivity type;
   an emitting gate region of said first semiconductor conductivity type formed in said second exterior layer of said semiconductor body;
   a first gate electrode contacting said emitting gate region to provide switching control of said rectifier;
   an anode electrode contacting said first exterior layer of said semiconductor body;
   a cathode electrode contacting said second exterior layer of said semiconductor body; and
   a second gate electrode contacting an intermediate layer of said semiconductor body having said first semiconductor conductivity type, said intermediate layer extending through a portion of said second exterior layer and said second gate electrode lying adjacent said cathode electrode but which is electrically and spatially isolated from said emitting gate region.

2. An emitter gate semiconductor rectifier comprising:
   a semiconductor body including at least four interleaved layers of alternating opposite first and second semiconductor conductivity types to form a plurality of P-N junctions;
   said semiconductor body having a first exterior layer of said first semiconductor conductivity type and a second exterior layer of said second semiconductor conductivity type;
   an emitting gate region of said first semiconductor conductivity type formed in said second exterior layer of said semiconductor body;
   a first gate electrode contacting said emitting gate region to provide switching control of said rectifier;
   an anode electrode contacting said first exterior layer of said semiconductor body;
   a cathode electrode contacting said second exterior layer of said semiconductor body; and
   a plurality of second gate electrodes each contacting a separate one of said intermediate layers of said first semiconductor conductivity type and being electrically and spatially isolated from said emitting gate region.

3. An emitter gate silicon controlled rectifier comprising:
   a semiconductor body including at least four interleaved layers of alternating opposite first and second semiconductor conductivity types to form a plurality of P-N junctions;
   said semiconductor body having a first exterior layer of said first semiconductor conductivity type and a second exterior layer of said second semiconductor conductivity type;
   a first region of said first conductivity type formed in said second exterior layer of said semiconductor body;
   a first electrode contacting said first region to form a first switch gate;
   a second electrode contacting said second exterior layer of said semiconductor body to form a switch cathode;
   a plurality of third electrodes each contacting a separate one of the interior layers of said first semiconductor conductivity type to form a plurality of second switch gates; and
   a fourth electrode contacting said first exterior layer of said semiconductor body to form a switch anode.

4. The rectifier of claim 3 wherein said first semiconductor conductivity type comprises P-type material.

5. The rectifier of claim 3 and further comprising:
   a second region of highly doped second semiconductor conductivity type formed in said second exterior layer of said semiconductor body in contact with said second electrode.

6. The rectifier of claim 3 and further comprising:
   a groove formed in said second exterior layer between said first and second electrodes.

* * * * *